US007393428B2

(12) United States Patent
Huang et al.

(10) Patent No.: US 7,393,428 B2
(45) Date of Patent: Jul. 1, 2008

(54) METHOD FOR MAKING A THERMAL INTERFACE MATERIAL

(75) Inventors: Hua Huang, Beijing (CN); Yang Wu, Beijing (CN); Chang-Hong Liu, Beijing (CN); Shou-Shan Fan, Beijing (CN)

(73) Assignees: Tsinghua University, Beijing (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 223 days.

(21) Appl. No.: 11/321,315

(22) Filed: Dec. 29, 2005

(65) Prior Publication Data

US 2008/0128122 A1    Jun. 5, 2008

(30) Foreign Application Priority Data

Mar. 24, 2005    (CN)    ......................... 2005 1 0033840

(51) Int. Cl.
*B32B 37/00*    (2006.01)
(52) U.S. Cl. ........................................ 156/249; 156/296
(58) Field of Classification Search ................. 156/247, 156/249, 296; 264/271.1
See application file for complete search history.

(56) References Cited

U.S. PATENT DOCUMENTS

| 6,350,488 | B1 | | 2/2002 | Lee et al. | |
| 6,407,922 | B1 | | 6/2002 | Eckblad et al. | |
| 6,924,335 | B2 | * | 8/2005 | Fan et al. | 524/495 |
| 7,109,581 | B2 | * | 9/2006 | Dangelo et al. | 257/720 |
| 7,150,801 | B2 | * | 12/2006 | Fujii et al. | 156/234 |
| 7,160,620 | B2 | * | 1/2007 | Huang et al. | 428/408 |
| 7,291,396 | B2 | * | 11/2007 | Huang et al. | 428/408 |
| 2003/0151030 | A1 | * | 8/2003 | Gurin | 252/502 |
| 2005/0167647 | A1 | * | 8/2005 | Huang et al. | 257/14 |
| 2005/0176869 | A1 | * | 8/2005 | Lee et al. | 524/490 |
| 2005/0255304 | A1 | * | 11/2005 | Brink | 428/209 |
| 2006/0035087 | A1 | * | 2/2006 | Yadav et al. | 428/411.1 |
| 2006/0055074 | A1 | * | 3/2006 | Huang et al. | 264/134 |
| 2006/0208354 | A1 | * | 9/2006 | Liu et al. | 257/707 |
| 2006/0219689 | A1 | * | 10/2006 | Huang et al. | 219/213 |
| 2006/0231970 | A1 | * | 10/2006 | Huang et al. | 264/134 |
| 2007/0004081 | A1 | * | 1/2007 | Hsiao | 438/106 |

OTHER PUBLICATIONS

Berber, Savas et al., "Unusually High Thermal Conductivity of Carbon Nanotubes," *Physical Review Letters*, vol. 84, No. 20, pp. 4613-4616 (2000).
Fan, Shoushan et al., "Self-Oriented Regular Arrays of Carbon Nanotubes and Their Field Emission Properties," *Science*, vol. 283, pp. 512-514 (1999).
Liu, Liang et al., "Isotope Labeling of Carbon Nanotubes and Formation of $^{12}C$-$^{13}C$ Nanotube Junctions," *J. Am. Chem. Soc.*, vol. 123, pp. 11502-11503 (2001).

* cited by examiner

*Primary Examiner*—Leonard R Leo
(74) *Attorney, Agent, or Firm*—Morris Manning Martin LLP; Tim Tingkang Xia, Esq.

(57) ABSTRACT

A thermal interface material includes a matrix, a plurality of carbon nanotubes, and at least one phase change layer. The matrix includes a first surface and an opposite second surface. The carbon nanotubes are embedded in the matrix uniformly. The carbon nanotubes extend from the first surface to the second surface and have two opposite ends. At least one of the two opposite ends of the carbon nanotubes is exposed out of one of the first and second surfaces of the matrix. The at least one phase change layer is formed on the exposed end of the carbon nanotubes.

7 Claims, 5 Drawing Sheets

METHOD FOR MAKING A THERMAL INTERFACE MATERIAL

CROSS-REFERENCES TO RELATED APPLICATIONS

This application is related to four corresponding U.S. patent applications as follows: application Ser. No. 11/024,513, filed on Dec. 29, 2004, entitled "THERMAL INTERFACE MATERIAL AND METHOD FOR MANUFACTURING SAME"; application Ser. No. 11/025,160, filed on Apr. 21, 2005, entitled "METHOD FOR MANUFACTURING CARBON NANOTUBES WITH UNIFORM LENGTH"; application Ser. No. 11/089,864, filed on Mar. 25, 2005, entitled "THERMAL INTERFACE MATERIAL AND METHOD FOR MANUFACTURING SAME"; and application Ser. No. 11/321,278, filed on Dec. 29, 2005 entitled "THERMAL INTERFACE MATERIAL AND METHOD FOR MANUFACTURING SAME"; each of the above-identified applications having the same assignee as the instant application. The disclosures of the above-identified applications are incorporated herein by reference.

BACKGROUND

1. Technical Field

The invention relates generally to thermal interface materials and making methods thereof; and more particularly to a thermal interface material which conducts heat by using carbon nanotubes, and a making method thereof.

2. Discussion of the Related Art

Electronic components such as semiconductor chips are becoming progressively smaller, while at the same time heat dissipation requirements thereof are increasing. Commonly, a thermal interface material is utilized between the electronic component and a heat sink in order to efficiently dissipate heat generated by the electronic component.

A conventional thermal interface material is made by diffusing particles with a high heat conduction coefficient in a base material. The particles can be made of graphite, boron nitride, silicon oxide, alumina, silver, or other metals. However, a heat conduction coefficient of the thermal interface material is now considered to be too low for many contemporary applications, because it cannot adequately meet the heat dissipation requirements of modern electronic components.

A new kind of thermal interface material has recently been developed. The thermal interface material is obtained by fixing carbon fibers with a polymer. The carbon fibers are distributed directionally, and each carbon fiber can provide a heat conduction path. A heat conduction coefficient of this kind of thermal interface material is relatively high. However, the thickness of this kind thermal interface material is limited to be greater than 40 micrometers, and the heat conduction coefficient of the thermal interface material is inversely proportional to a thickness thereof. In other words, the heat conduction coefficient is limited to a certain value corresponding to a thickness of 40 micrometers. The value of the heat conduction coefficient cannot be increased, because the thickness cannot be reduced.

An article entitled "Unusually High Thermal Conductivity of Carbon Nanotubes" and authored by Savas Berber (page 4613, Vol. 84, Physical Review Letters 2000) discloses that a heat conduction coefficient of a carbon nanotube can be 6600 W/mK (watts/milliKelvin) at room temperature.

U.S. Pat. No. 6,407,922 discloses another kind of thermal interface material. The thermal interface material is formed by injection molding, and has a plurality of carbon nanotubes incorporated in a matrix material. A first surface of the thermal interface material engages with an electronic element, and a second surface of the thermal interface material engages with a heat sink. The second surface has a larger area than the first surface, so that heat can be uniformly spread over the larger second surface.

However, the thermal interface material formed by injection molding is relatively thick. This increases a bulk of the thermal interface material and reduces its flexibility. Furthermore, the carbon nanotubes are disposed in the matrix material randomly and multidirectionally. This means that heat does not necessarily spread uniformly through the thermal interface material. In addition, the heat does not necessarily spread directly from the first surface engaged with the electronic element to the second surface engaged with the heat sink.

What is needed, therefore, is a thermal interface material that has a high heat conduction coefficient and a low thermal interface resistance thereby enhancing heat conducting efficiency thereof.

What is also needed, therefore, is a method for making the above-described thermal interface material.

SUMMARY

In accordance with a embodiment, a thermal interface material includes a matrix, a plurality of carbon nanotubes, and at least one phase change layer. The matrix includes a first surface and an opposite second surface. The carbon nanotubes are embedded in the matrix uniformly. Each carbon nanotube extends from the first surface to the second surface and has two opposite ends. At least one of the two opposite ends of the carbon nanotubes is exposed out of one of the first and second surfaces of the matrix. The at least one phase change layer is formed on the exposed end of the carbon nanotubes.

In accordance with another embodiment, a method for making the thermal interface material includes the steps of:

(a) providing a plurality of carbon nanotubes having two opposite ends;

(b) forming a protective layer on at least one of the two ends of the carbon nanotubes;

(c) injecting curable liquid matrix into clearances among the carbon nanotubes and curing the liquid matrix;

(d) removing the protective layer to expose at least one of the two ends of the carbon nanotubes;

(e) forming a phase change layer on the exposed end of the carbon nanotubes.

Other objects, advantages and novel features of the invention will become more apparent from the following detailed description when taken in conjunction with the accompanying drawings.

BRIEF DESCRIPTION OF THE DRAWINGS

Many aspects of the thermal interface material can be better understood with reference to the following drawings. The components in the drawings are not necessarily to scale, the emphasis instead being placed upon clearly illustrating the principles of the present thermal interface material. Moreover, in the drawings, like reference numerals designate corresponding parts throughout the several views.

DETAILED DESCRIPTION OF THE INVENTION

Embodiments of the present thermal interface material will now be described in detail below and with reference to the drawings.

Figure 1:
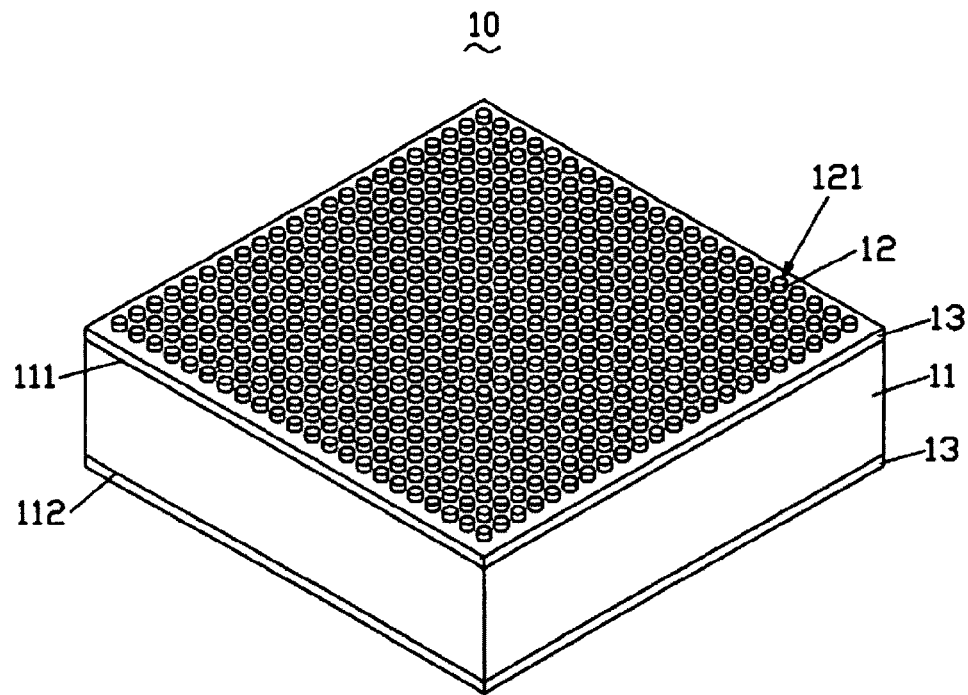
FIG. 1 is a perspective view of a thermal interface material according to a preferred embodiment.
Figure 2:
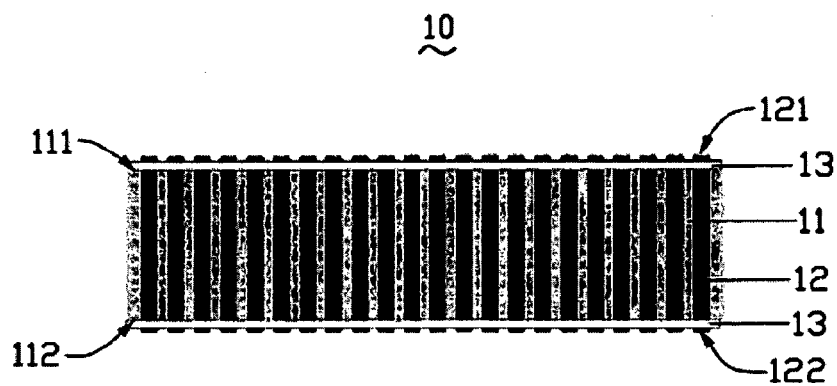
FIG. 2 is a schematic side view of the thermal interface material of FIG. 1.

Referring to FIGS. 1 and 2, a thermal interface material (TIM) 10 includes a matrix 11, a plurality of carbon nanotubes (CNTs) 12, and dual phase change layers 13. The matrix 11 has a first surface 111 and an opposite second surface 112. The CNTs 12 are embedded in the matrix 11 uniformly. The CNTs 12 have a first end 121 and an opposite second end 122. The two opposite ends 121 and 122 are exposed out of the first and second surfaces 111, 112 of the matrix 11, respectively. The dual phase change layers 13 are formed on the two ends 121 and 122, respectively.

The first and second surfaces 111, 112 of the matrix 11 are substantially parallel to one another. The matrix 11 preferably has a thickness in the range from 1 to 1000 micrometers. In the preferred embodiment, the thickness of the matrix 11 is 20 micrometers. The matrix 11 is comprised, for example, of a macromolecular material selected from the group consisting of silicone elastomer, polyester, polyvinyl chloride, polyvinyl alcohol, polyethylene, polypropylene, epoxy resin, polycarbonate resin, polyoxymethylene, and polyacetal.

The CNTs 12 are beneficially in a form of an aligned CNT array. The CNTs 12 are substantially parallel to each other. Further, the CNTs 12 are substantially perpendicular to the first surface 111 and the second surface 112. Thus, each carbon nanotube 12 can provide a heat conduction path in a direction perpendicular to a selected main heat-absorbing surface of the TIM 10.

In the illustrated embodiment (e.g., see FIG. 2), each carbon nanotube 12 extends out of the first and second surfaces 111, 112 of the matrix 11, thereby exposing the first and second ends 121, 122. Alternatively, one of the first and second ends 121, 122 of the CNTs 12 extends out of the first and second surfaces 111, 112 of the matrix 11, thereby exposing one of the first and second ends 121, 122.

The dual phase change layers 13 are formed on the first and second surfaces 111, 112, respectively. The dual phase change layers 13 are configured, for example, for filling the gaps between the exposed first and second ends 121, 122 of adjacent CNTs 12. Further, the first and second ends 121, 122 beneficially extend out of a respective phase change layer 13.

Alternatively, when only one end of the CNTs 12 is exposed out of one of the first and second surfaces 111, 112 of the matrix 11, only one phase change layer 13 is correspondingly employed and formed thereon.

Each phase change layer 13 preferably has a thickness in the range from 1 to 100 micrometers. In the preferred embodiment, the thickness of each phase change layer 13 is 10 micrometers. Each phase change layer 13 is comprised, e.g., of a phase change material selected from the group consisting of paraffin, polyolefin, low molecular polyester, low molecular epoxy resin, and low molecular polyacrylate. Each phase change layer 13 preferably has a desirable phase change temperature, which is corresponding to an operating temperature of a heat-generating element (e.g., an electronic element), for example, in the range from about 20° C. to about 90° C.

Figure 3:
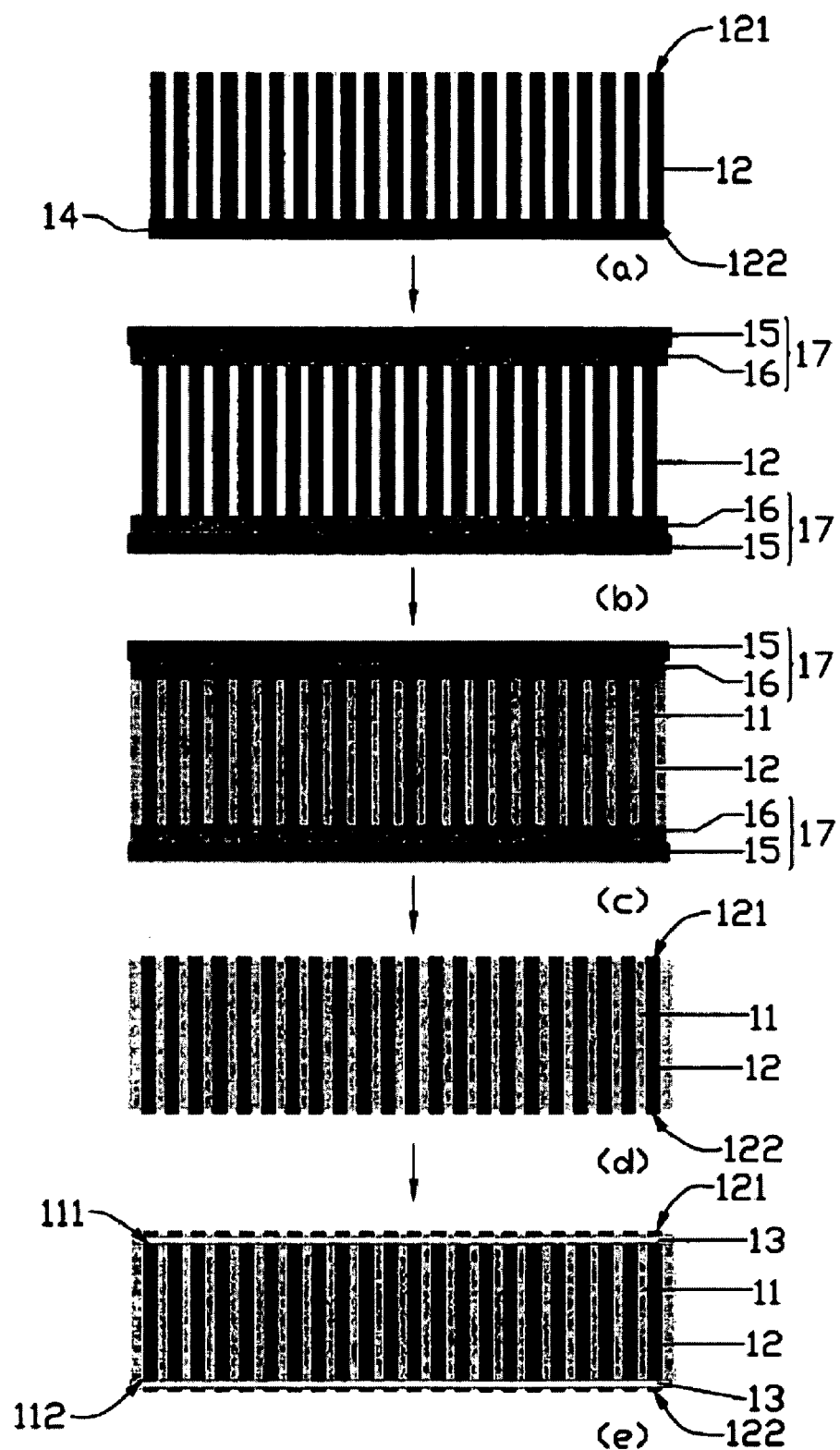
FIG. 3 is schematic flow chart of a method for making the thermal interface material of FIG. 2.

FIG. 3 shows a flow chart of a method for making the above-described TIM 10. In the illustrated embodiment, the method includes the following steps:

(a) providing a plurality of CNTs 12 having two opposite ends;

(b) forming a protective layer 17 on the two ends of the CNTs 12;

(c) injecting curable liquid matrix 11 into clearances among the CNTs 12 and curing the liquid matrix 11;

(d) removing the protective layer 17 to expose the two ends of the CNTs 12;

(e) forming a phase change layer 13 on the two ends of the CNTs 12, respectively.

In step (a), the CNTs 12 are formed by a method selected from the group consisting of a chemical vapor deposition (CVD) method, a plasma-enhanced chemical vapor deposition (PECVD) method, and a hot-filament chemical vapor deposition (HFCVD) method. In the preferred embodiment, the CNTs 12 are formed by a chemical vapor deposition method, and reference is made to an article entitled "Self-Oriented Regular Arrays of CNTs and Their Field Emission Properties", *Science*, 1999, Vol. 283, pp. 512-514. In brief, a substrate (e.g., a silicon substrate) is coated with an Fe film of 5 nm thick and then annealed in air at 300° C. The growth of CNTs 12 is then performed in a CVD chamber and using ethylene as a feed gas at 700° C. As shown in FIG. 3a, the CNTs 12 are formed on a substrate 14. The CNTs 12 have a first end 121 and an opposite second end 122. The CNTs 12 are parallel to one another. The substrate 14 can be gently stripped away from the CNTs 12, thereby obtaining the isolated CNTs 12.

Figure 4:
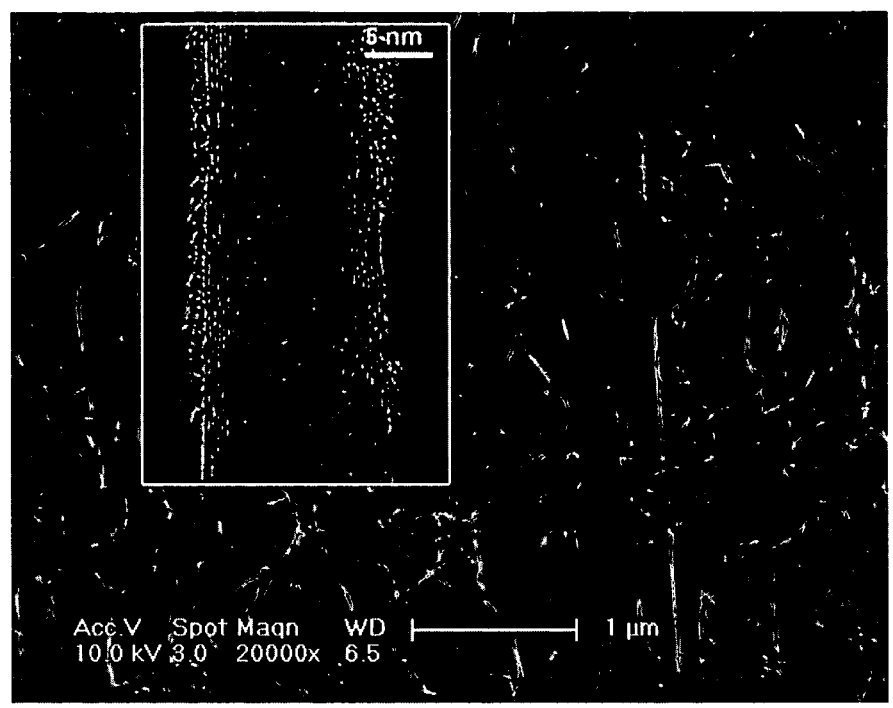
FIG. 4 is a scanning electron microscope (SEM) image of a side view of aligned carbon nanotubes formed in step (a) of FIG. 3.

FIG. 4 illustrates an SEM image of a side view of the CNTs formed by the above-described CVD method. The CNTs are essentially similar to the CNTs 12 as shown in FIG. 3a and form a thick layer of the CNTs forest. The CNTs layer has a highness of about 0.5 mm. The inset of FIG. 4 is a high-resolution transmission electron microscope (HRTEM) image of a single exemplary MWCNT of the CNTs. The single MWCNT has eight coaxial graphite layers and has an outer diameter of about 12 nm.

In step (b), briefly, a pressure sensitive adhesive layer 16 is coated on a supporting film 15 comprised of a polymer (e.g., polyester) thereby forming a protective layer 17. Then the protective layer 17 is formed on the first end 121 (see FIG. 3a) of as-prepared CNTs 12 by gently pressing, thereby securing the first end 121 of the CNTs 12 in the protective layer 17. Further, another protective layer 17 could be formed on the second end 122 (see FIG. 3a) of the CNTs 12 by a similar step to the step (b). As such, the two ends of the CNTs 12 are secured in the corresponding protective layer 17, as shown in FIG. 3b. The protective layer 17 is advantageously 0.05 mm thick.

Alternatively, after the formation of the protective layer 17 on the first end of the CNTs 12, the CNTs 12 is directly conducted to the next step. In this case, only the first end 121 of the CNTs 12 is covered by the protective layer 17 and thereby extending out of a corresponding surface of the matrix 11 according to the following steps, instead.

In step (c), the injection is performed by the step, for example, of submerging the CNTs 12 into the liquid matrix 11, and then curing the liquid matrix 11 in a vacuum chamber at room temperature for 25 hours. As shown in FIG. 3c, the cured matrix 11 thereby is inserted into clearances among the adjacent CNTs 12. The liquid matrix 11 is advantageously a polymer solution comprised of the above-mentioned matrix material in the TIM 10. Taking a silicone elastomer for an example, the liquid matrix 11 includes a S160 solution (i.e., Sylgard 160 produced by Dow Corning) and ethyl acetate at a volume ratio of 1:1.

In step (d), the protective layer 17, i.e., the supporting film 15 and pressure sensitive adhesive layer 16, is removed thereby exposing the first and second ends 121, 122 of the CNTs 12 at the first and second surfaces 111, 112 of the matrix 11. The protective layer 17 may be removed, for example, by directly stripping off the supporting film 15 and sequentially dissolving away the remaining pressure sensitive adhesive layer 16 in a xylene solution. Thus, a composite film of the CNTs 12 embedded in S160 matrix 11 can be obtained, as shown in FIG. 3d.

Figure 5:
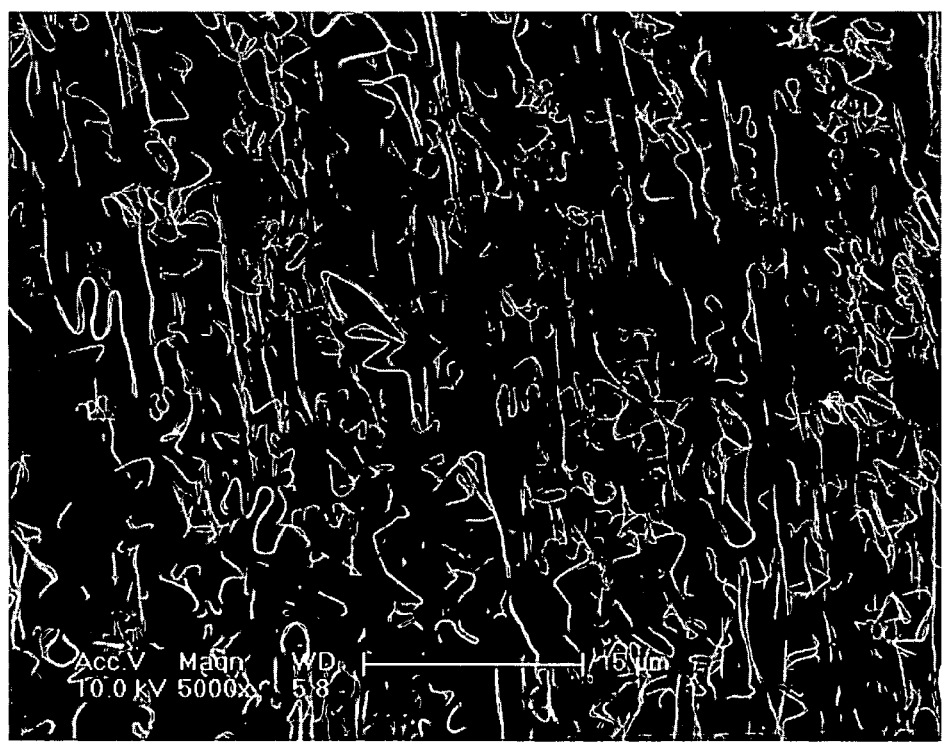
FIG. 5 is an SEM image of a side view of a composite formed in step (d) of FIG. 3, showing the carbon nanotubes embedded into a matrix.

FIG. 5 illustrates an SEM image of a side view of an exemplary composite film of CNTs embedded in S160 matrix. With the CNTs embedded in the S160 matrix, the pristine gray S160 generally turns black and the outline of the composite film of the CNTs is essentially the same with the original CNTs. That is, the CNTs are still aligned in the S160 matrix.

Figure 6:
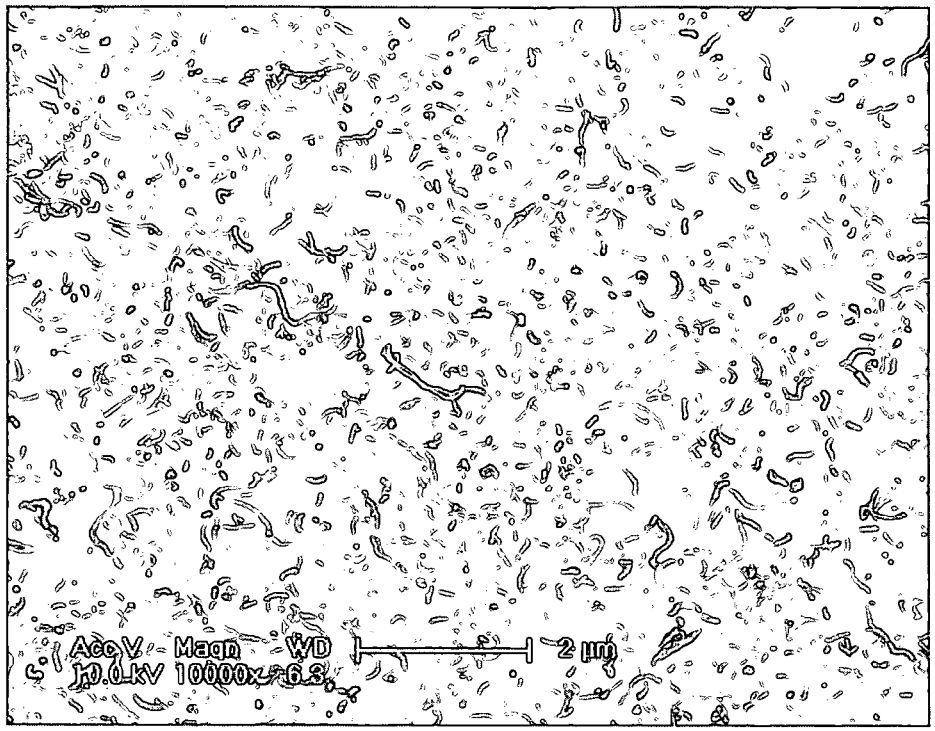
FIG. 6 is similar to FIG. 5, but showing a top view of the composite.

FIG. 6 illustrates an SEM image of a top view of the exemplary composite film of CNTs embedded in S160 matrix. There is shown that most of the ends of the aligned CNTs extend out of the surface of the S160 matrix.

Figure 7:
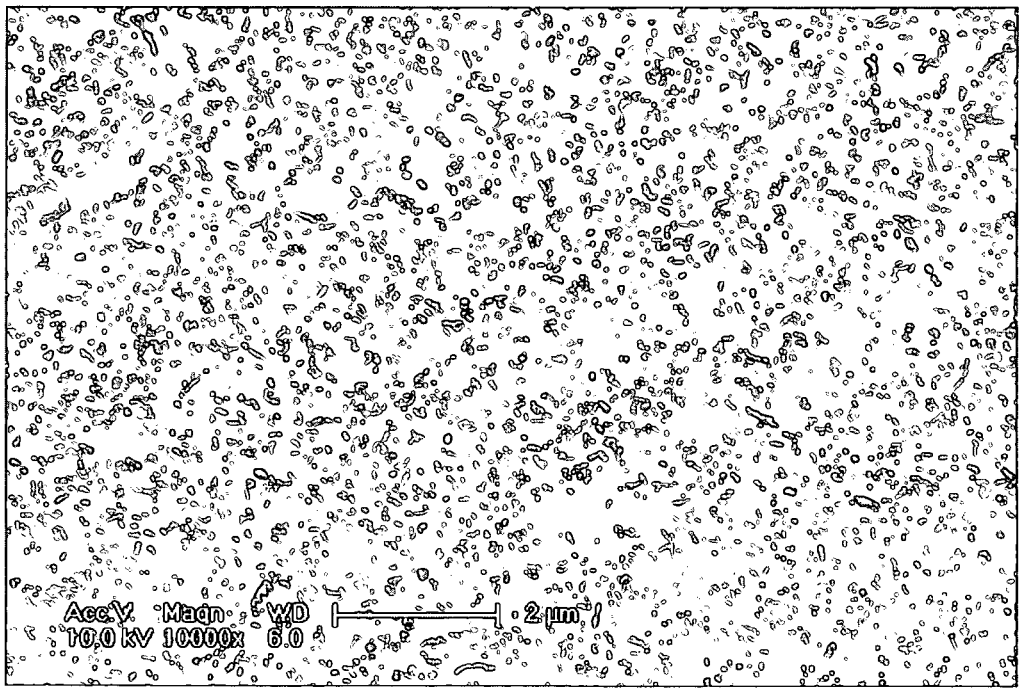
FIG. 7 is similar to FIG. 6, but showing a top view of the composite after reactive ion etching treatments.

Further treatments on the first and/or second surfaces 111, 112 of the matrix 11 could be optionally conducted by reactive ion etching (RIE) to ensure all CNT ends revealed. The RIE processes could be carried out, for example, by using oxygen plasma at a pressure of 6 Pa and with a power of 150 W for 15 minutes at each surface of the matrix 11. As shown in FIG. 7, after RIE treatment, all of the ends of the aligned CNTs extend out of the S160 matrix.

In step (e), in the illustrated embodiment, the dual phase change layers 13 are formed on the first and second surfaces 111, 112. The formation of each phase change layer 13 is performed, for example, by directly adhering a phase change material sheet on the corresponding surface 111, 112 of the matrix 11 below the phase change temperature, thereby forming the TIM 10.

Alternatively, the formation of each phase change layers 13 is performed, e.g., by the following steps of: submerging the corresponding surface of the matrix 11 into a liquid phase change material solution, and then adsorbing and thus removing the undesirable liquid phase change material by using a filter paper.

In addition, by decreasing the thickness of each phase change layers 13 formed on the corresponding surface of the matrix 11, the ends 121 and/or 122 of the CNTs could further extend out of the surface of the corresponding phase change layer 13.

While only the first end 121 of the CNTs 12 is covered by the protective layer 17, the first end 121 of the CNTs 12 is correspondingly exposed out of the first surface 111 of the matrix 11 after the above-described step (c) and (d). Inversely, the second end 122 of the CNTs 12 is submerged by the cured matrix 11. Thus, in step (e), only one phase change layer is formed on the exposed first end 121 of the CNTs 12.

Figure 8:
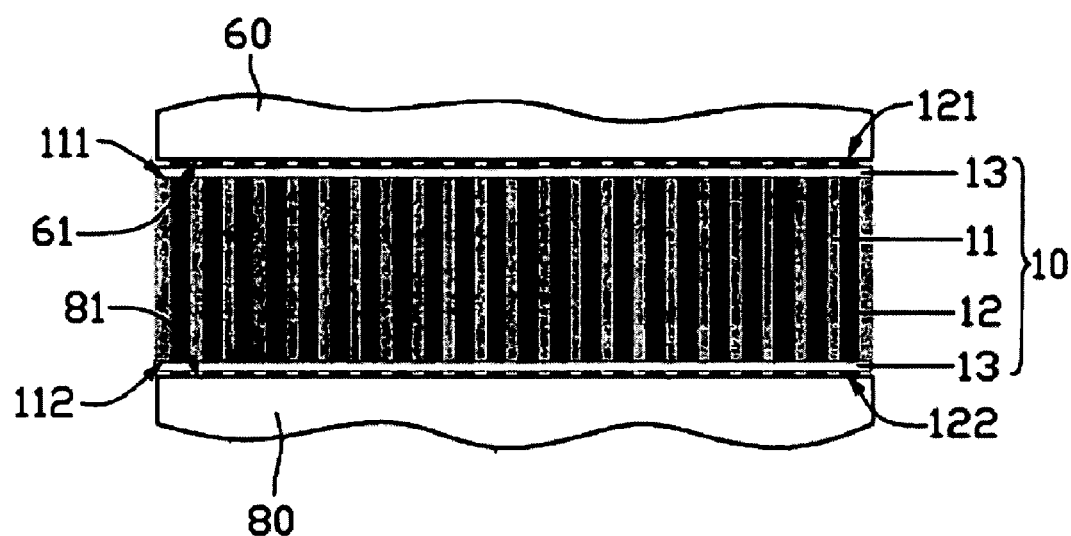
FIG. 8 is a schematic plan view of the thermal interface material of FIG. 2 applied between an electronic element and a heat sink.

FIG. 8 illustrates an application of the TIM 10. The TIM 10 is sandwiched between a heat sink 60 and a heat-generating element 80, for providing good heat contact between the heat sink 60 and the heat-generating element 80. The first ends 121 of the CNTs 12 thermally contact to an underside 61 of the heat sink 60, and the second ends 122 of the CNTs 12 thermally contact to a topside 81 of the electronic element 80, thereby forming a plurality of orient heat conduction paths.

Because the thickness of the TIM 10 is in a micron scale, the TIM 10 has good flexibility. Thus, even if the surface of the electronic element 80 is uneven, the thermal interface material can provide good heat contact between the heat sink 60 and the electrical element 80. Furthermore, the ends of the CNTs 12 extend out of the first and second surface 111, 112 of the TIM 10. This ensures that the CNTs 12 thermally contact the electronic element 80 and the heat sink 60 directly.

The phase change layers 13 are capable of filling the gaps between the exposed first and/or second ends 121, 122 of adjacent CNTs 12. The thermal interface resistances induced by the gaps are thereby decreased. As a result, the heat conducting efficiency of the TIM 10 is further enhanced.

It is understood that the above-described embodiments and methods are intended to illustrate rather than limit the invention. Variations may be made to the embodiments and methods without departing from the spirit of the invention. Accordingly, it is appropriate that the appended claims be construed broadly and in a manner consistent with the scope of the invention.

What is claimed is:

1. A method for making a thermal interface material, the method comprising the steps of:
   providing a plurality of carbon nanotubes having two opposite ends;
   forming a protective layer on at least one of the two ends of the carbon nanotubes;
   injecting curable liquid matrix into clearances among the carbon nanotubes and curing the liquid matrix;
   removing the protective layer to expose at least one of the two ends of the carbon nanotubes; and
   forming a phase change layer on the exposed end of the carbon nanotubes.

2. The method according to claim 1, wherein the carbon nanotubes are formed by a method selected from the group consisting of a chemical vapor deposition method, a plasma-enhanced chemical vapor deposition method, and a hot-filament chemical vapor deposition method.

3. The method according to claim 1, wherein the protective layer comprises a supporting film and a pressure sensitive adhesive layer formed thereon.

4. The method according to claim 3, wherein the supporting film is capable of being gently stripped off, and the pressure sensitive adhesive layer is capable of being dissolved away in a xylene solution.

5. The method according to claim 1, wherein the phase change layer is formed on the exposed end of the carbon nanotubes by directly adhering a phase change material sheet thereon below a phase change temperature.

6. The method according to claim 1, wherein the phase change layer is formed on the exposed end of the carbon nanotubes by the steps of: submerging the exposed end of the carbon nanotubes into a liquid phase change material solution; and removing undesired liquid phase change material by using a filter paper.

7. The method according to claim 1, further comprising a step of etching at least one of the first and second surfaces of the matrix by using a reactive ion etching method prior to forming a phase change layer.

* * * * *